US006037658A

United States Patent [19]
Brodsky et al.

[11] Patent Number: 6,037,658
[45] Date of Patent: Mar. 14, 2000

[54] ELECTRONIC PACKAGE WITH HEAT TRANSFER MEANS

[75] Inventors: William Louis Brodsky, Binghamton; Glenn Lee Kehley, Endicott; Sanjeev Balwant Sathe, Johnson City; John Robert Slack, Vestal, all of N.Y.

[73] Assignee: International Business Machines Corporation, Armonk, N.Y.

[21] Appl. No.: 08/944,615

[22] Filed: Oct. 7, 1997

[51] Int. Cl.[7] .............................. H01L 23/10; H01L 23/34
[52] U.S. Cl. .................... 257/707; 257/706; 257/712; 361/705
[58] Field of Search ................... 257/706, 712, 257/707; 361/705

[56] References Cited

U.S. PATENT DOCUMENTS

| | | | |
|---|---|---|---|
| 4,004,195 | 1/1977 | Harayda et al. | 257/706 |
| 4,415,025 | 11/1983 | Horvath | 165/185 |
| 4,593,342 | 6/1986 | Lindsay | 361/386 |
| 4,612,978 | 9/1986 | Cutchaw | 165/104.33 |
| 4,914,551 | 4/1990 | Anschel et al. | 361/389 |
| 4,942,076 | 7/1990 | Panicker et al. | 428/137 |
| 4,962,416 | 10/1990 | Jones et al. | 357/81 |
| 4,967,950 | 11/1990 | Legg et al. | 228/180.2 |
| 5,060,844 | 10/1991 | Behun et al. | 228/180.2 |
| 5,226,471 | 7/1993 | Stefani | 165/13 |
| 5,269,372 | 12/1993 | Chu et al. | 165/80.4 |
| 5,345,107 | 9/1994 | Daikoku et al. | 257/717 |
| 5,423,376 | 6/1995 | Julien et al. | 165/80.4 |
| 5,459,352 | 10/1995 | Layton et al. | 257/724 |
| 5,499,450 | 3/1996 | Jacoby | 29/890.03 |
| 5,519,936 | 5/1996 | Andros et al. | 29/840 |
| 5,522,452 | 6/1996 | Mizuno et al. | 165/40 |
| 5,561,323 | 10/1996 | Andros et al. | 257/707 |
| 5,783,862 | 7/1998 | Deeney | 257/714 |

OTHER PUBLICATIONS

.Energy Absorbing Foam Metals., Environmental Science and Technology, Los Alamos National Laboratory, Los Alamos, California.

*Primary Examiner*—Teresa M. Arroyo
*Attorney, Agent, or Firm*—Scully, Scott, Murphy & Presser

[57] ABSTRACT

An electronic package including as part thereof a thermally conductive arrangement for restricting thermal fluid material motion about a heat-generating device, thereby assuring effective heat transference from the heat-generating device (e.g., module) to a cooling member (e.g., spaced heat sink), this arrangement preferably including: (1) a thermal fluid (e.g., thermal grease); and (2) structural elements (e.g., wire mesh, heat sink ridges, etc.). For restricting fluid movement, sealing structures (e.g., external gaskets) may be used to further assure fluid containment to a specified location. Pressure generation means (e.g., a plunger) can be used to increase fluid pressure when pressure droppages occur.

40 Claims, 8 Drawing Sheets

ELECTRONIC PACKAGE WITH HEAT TRANSFER MEANS

TECHNICAL FIELD

This invention relates to electronic packaging and more particularly to thermal connection of electronic devices (e.g., chips, modules, etc.) to cooling devices (e.g., heat sinks) used in electronic packaging.

BACKGROUND OF THE INVENTION

Electronic packages which include semiconductor devices (e.g., silicon chips) as part thereof are known in the computer industry, with some examples being shown and described in U.S. Pat. No. 4,004,195 (Harayda et al), U.S. Pat. No. 4,415,025 (Horvath) and U.S. Pat. No. 4,593,342 (Lindsay).

Use of high circuit densities in modem electronic packaging, including particularly those packages which use a number of semiconductor devices, require effective removal of heat generated during package operation in order to assure that the operating parameters of such devices are maintained within specified tolerances to thereby prevent destruction of the package from overheating. One well known means for providing such heat removal is to utilize a metallic heat sink or similar member which typically forms an integral part of the package. Representative examples of such heat removal means are described in the aforementioned patents and those listed hereinbelow.

U.S. Pat. No. 5,269,372 (Chu et al) describes a cooling system including a planar cold plate which serves as a cooling member. This cold plate utilizes a plurality of flow channels in combination with supply and return conduits for carrying cooling fluid. U.S. Pat. No. 5,423,376 (Julien et al) describes a heat exchanger structure that is used as a cooling member for electronic components. This structure uses a plurality of stacked plates each having air-deflecting vanes that must align in a particular orientation to effect cooling. U.S. Pat. No. 5,499,450 (Jacoby) describes a means of attaching wires to a plate to thereby form an air-cooled heat sink which also serves as a cooling member. Several individual U-shaped conductors must be positioned in spaced orientation along elongated slots in the heat sink's base. U.S. Pat. No. 5,522,452 (Mizuno et al) describes a means of operating a liquid cooling system which can be used with a cold plate (e.g., such as described in U.S. Pat. No. 5,269,372 above). The fabrication and assembly of multi-chip or multiple electronic device packages is described in U.S. Pat. No. 5,345,107 (Daikoku et al). A multiple grooved heat transfer surface of a "cooling body" is used, in combination with a high viscosity fluid layer having thermally conductive powder as part thereof The electronic package of the instant invention provides for enhanced heat removal therefrom through providing a porous member to retain and restrain a thermally conductive fluid connection between an electronic device and a cooling member. Such a structure obviates many of the problems associated with structures such as described hereinabove and thus represents a significant advancement in the art.

OBJECTS AND SUMMARY OF THE INVENTION

It is, therefore, a primary object of the invention to enhance the art of electronic packaging by providing a package possessing the several advantageous features cited therein.

It is another object of the invention to provide a heat transfer structure for use with electronic packaging assemblies wherein the structure is of relatively simple and thus relatively inexpensive construction.

It is still another object of the invention to provide a heat transfer structure capable of being used with many of today's package designs.

In accordance with one aspect of the invention, there is provided an electronic package comprising an electronic device having a heat transfer surface and a cooling member thermally coupled to the heat transfer surface of the electronic device for conducting heat away from the electronic device. The thermal coupling is provided by a heat transfer means positioned between the heat transfer surface of the electronic device and the cooling member for transferring heat from the electronic device to the cooling member. The heat transfer means includes a thermally conductive fluid positioned in contact with the heat transfer surface and a porous member separate from the cooling member. The porous member is positioned substantially within the thermally conductive fluid and assists in retaining the thermally conductive fluid in position.

In accordance with another aspect of the invention, there is provided an electronic package comprising an electronic device having a heat transfer surface and a cooling member thermally coupled to the heat transfer surface of the device for conducting heat away from the device. The thermal coupling is provided by a heat transfer means positioned between the heat transfer surface of the electronic device and the cooling member for transferring heat from the electronic device to the cooling member. The heat transfer means includes a thermally conductive fluid positioned in contact with the heat transfer surface of the electronic device, the cooling member and a fluid retention means secured to the heat transfer surface and/or the cooling member. The fluid retention means is positioned substantially within the thermally conductive fluid for assisting in retaining the thermally conductive fluid in position for effective heat transfer.

In accordance with a further aspect of the invention, there is provided an information handling system comprising a circuitized substrate and an electronic package positioned on and electrically coupled to the circuitized substrate. The electronic package includes an electronic device having a heat transfer surface, a cooling member thermally coupled to the electronic device for conducting heat away from the electronic device, and a heat transfer means positioned between the heat transfer surface of the electronic device and the cooling member for transferring heat from the electronic device to the cooling member. The heat transfer means includes a thermally conductive fluid positioned in contact with the electronic device heat transfer surface, and a porous member that is positioned substantially within the thermally conductive fluid for assisting in retaining the thermally conductive fluid in position so that the fluid contacts the heat transfer surface of the electronic device and the cooling member.

In accordance with yet another aspect of the invention, there is provided an information handling system which comprises a circuitized substrate and an electronic package positioned on and electrically coupled to the circuitized substrate, the package including an electronic device having a heat transfer surface, a cooling member thermally coupled to the electronic device for conducting heat away from the electronic device, and heat transfer means positioned between the heat transfer surface of the electronic device and the cooling member for transferring heat from the electronic device to the cooling member. The heat transfer means includes a thermally conductive fluid positioned in contact with the heat transfer surface and the cooling member. A fluid retention means is secured to the heat transfer surface and/or the cooling member and positioned substantially within the spacedly conductive fluid for assisting in retaining the thermally conductive fluid in the position in contact with the heat transfer surface and the cooling member.

And, according to still another aspect of the invention, there is provided a heat transfer structure that can be utilized for assuring effective heat transference between a heat-generating device and associated cooling structure. The structure includes a porous member and a quantity of thermally conductive fluid positioned substantially on and around the porous member, the heat transfer structure adapted for being positioned between the electronic device and the cooling member.

BEST MODE FOR CARRYING OUT THE INVENTION

For a better understanding of the invention, together with other objects, advantages and capabilities thereof, reference is made to the following disclosure in connection with the aforementioned drawings.

Figure 1:
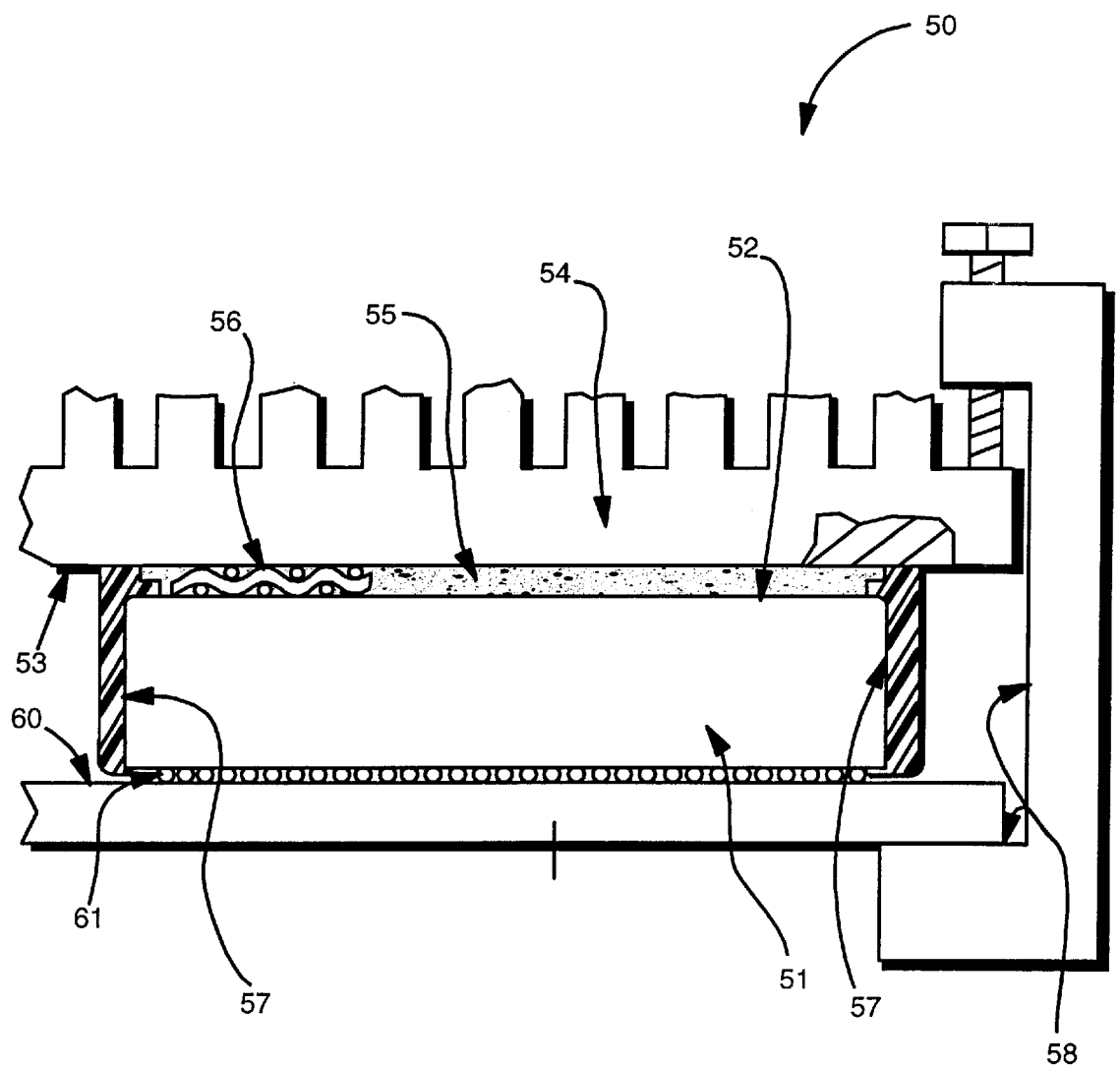
FIG. 1 is a partial, side elevational view, partly in cross-section, of a thermally conductive arrangement for restricting thermal fluid material motion in accordance with one embodiment of the invention.

In FIG. 1, there is shown an electronic package 50 for use in an information handling system, such as a computer, in accordance with a preferred embodiment of the invention. Package 50 includes an electronic device 51 having a heat transfer surface 52, a cooling member 53, and a heat transfer means 54 which includes a thermally conductive fluid 55 and a porous member 56. The porous member is a separate member from cooling member 53 and is positioned substantially within (and thus surrounded thereby) the thermally conductive fluid 55 for assisting in retaining the thermally conductive fluid in the illustrated, desired position contacting both the heat transfer surface 52 of device 51 and the cooling member 53. Means 54, as defined herein, assures optimal heat transfer from electronic device 51 to cooling member 53.

Electronic device 51 may be a single or multiple semiconductor chip module having an outer dielectric housing and/or a cap, both of which are known in the art. FIG. 1 shows electronic device 51 as a capped module positioned on and electrically coupled to a printed wiring board (PWB) 60 using a plurality of solder balls 61 which provide what are commonly referred to in the art as Ball Grid Array (BGA) connections. Examples are defined in U.S. Pat. No. 4,967,950 (Legg et al), U.S. Pat. No. 5,060,844 (Behun et al), U.S. Pat. No. 5,519,936 (Andros et al) and 5,561,323 (Andros et al), all of which are assigned to the assignee of the present invention and are incorporated herein by reference. The components of the electronic device, if of modular construction, may include a substrate, semiconductor chips, heat spreader, thermal grease and cap, depending on the design requirements. The present invention is designed to function with a variety of such structures, including those presently on the market.

Cooling member 53 may be a conventional heat sink, cold plate or similar device designed to conduct heat away from the electronic device to a medium (e.g., ambient air) having a lower temperature. The cooling medium may be a gas (such as air) if a heat sink is used or a liquid, such as water, if a known cold plate is utilized. The invention is adaptable to both possibilities. A cold plate may also be used with mixed phase cooling mediums such as water and air, oil and an inert gas, etc. When a cold plate is used with a water and air mixed phase medium, the gaseous portion of the mixture may be generated by boiling of the liquid phase. Cooling members, such as heatsinks and cold plates, are typically made of materials having high thermal conductivity. Typical cooling member materials are aluminum and copper.

The thermally conductive fluid 55 of heat transfer means 54 may be a thermal grease. Some known thermal greases include zinc oxide-filled silicone oil base, such as Wakefield Engineering 120 Series Thermal Joint Compound, or a particulate filled, low viscosity inert oil. The thermally conductive particulate fillers are so designed to improve the thermal conduction of the composite material. Examples of such fillers include aluminum, alumina, diamond, silicon carbide, etc.

Figure 2:
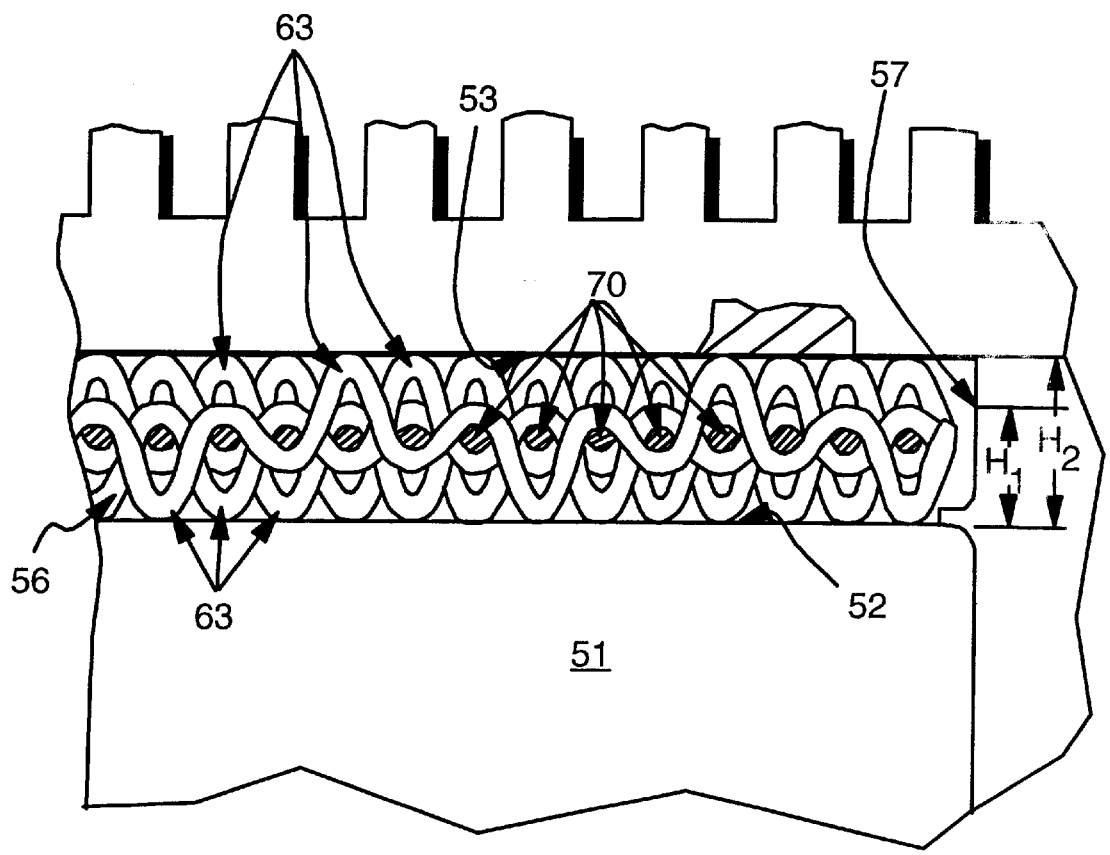
FIG. 2 is an enlarged side elevational view of a porous member of one embodiment of the invention located between an electronic device and a cooling member.

The porous member 56 of heat transfer means 54 is fabricated to restrain the thermally conductive fluid 55 during thermal cycling of the electronic device. FIG. 2 shows a cross-sectional view of a woven wire porous member 56 wherein the loops 63 formed during wire weaving have varying heights in a repeating pattern and are positionally located by warp members 70. The illustrated taller loops are designed to contact both the heat conducting surface 52 and the undersurface of cooling member 53. The height variation in the loops form at least two different groups of these members. The variation in loop heights can be adapted to accommodate various electronic devices of different sizes to assure cooling by a single cooling device of substantially planar design (e.g., heat sink 53 having a planar undersurface 53). The contact points between the porous member and conducting surface 53 and/or the cooling member provide a path of lower thermal conductivity than the conductive fluid. According to one embodiment, two groups of different height woven material may be used, the first having an overall height (H1) of approximately 0.5 millimeters (mm.) while the second group possesses a greater height (H2) of approximately 0.7 mm. Other groups, including those having the same or different heights than these, may be utilized. Each group may also have more than one height dimension for the several loops 63 to accommodate various spacings from electronic device 51 to cooling member 53 in a single electronic package 50. It is understood that the greatest height of these, while in compression or free standing, represents the overall spacing between module 51 and cooling member 53 in the finally assembled package assembly.

Figure 3:
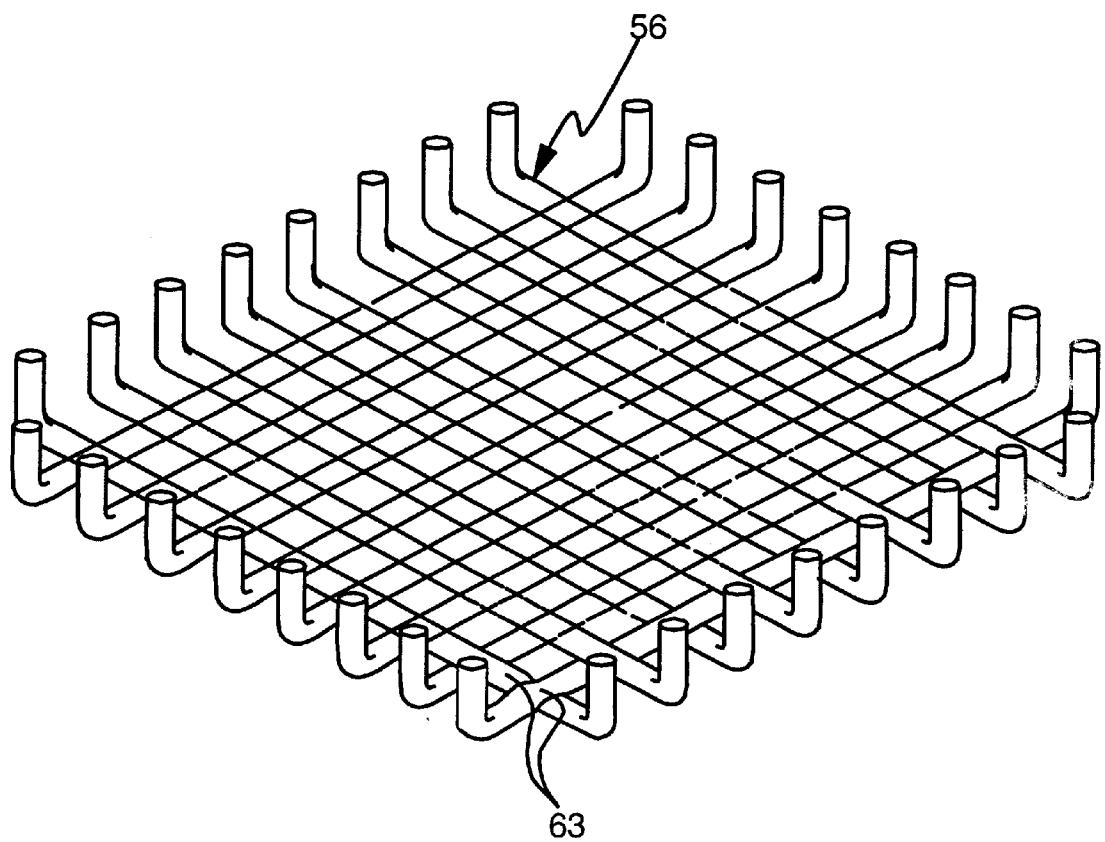
FIG. 3 is a perspective view of a porous member that may be located between an electronic device and a cooling member to form part of one embodiment of the heat transfer means of the invention.

FIG. 3 shows a perspective view of a woven porous member according to another embodiment of the invention. The member 56' in FIG. 3 has a uniform loop height, such that all loops 63' are substantially equal in height. Porous members 56 and 56' are preferably made of a material having high thermal conductivity. Some materials exhibiting this characteristic are copper, silver, boron nitride and silicon carbide. An additional advantageous feature of the porous member of the invention is its ability to spread the heat across the conducting surface of the electronic device, providing a more uniform temperature distribution and better utilization of the thermal interface. The invention's porous member may be a sintered structure made from a sound thermally conductive material, such as copper or aluminum. Additionally, porous member 56 may also be fabricated from a foamed metal structure. A foamed metal is defined as a metal formed under low gravity conditions (e.g., in space) from sputtered metal deposits. Energy absorbing, thermally conductive foam metals can be formed into molds of varying geometric configurations, thus allowing for the manufacture of relatively complex shapes. Retrofitting of such structures is thus possible, with these providing both energy absorption and structural reinforcement. Another advantage of foamed metals is in the repeatable crush energy of each structure. Further description of such metals is available from the Los Alamos National Laboratory, Los Alamos, Calif.

Figure 6:
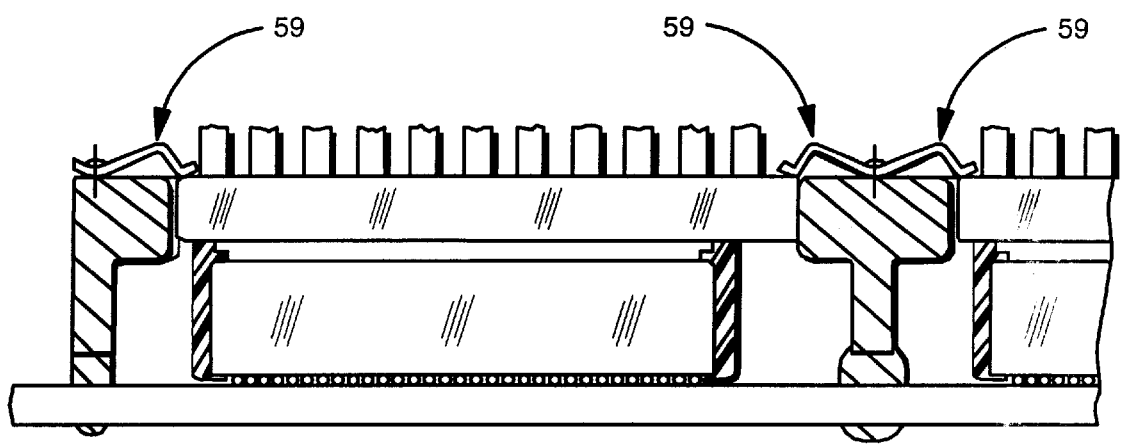
FIG. 6 is a side elevational view, partly in cross-section, of a thermally conductive structure having a spring clamping system for holding various parts of the invention's electronic package in a specified orientation.

A clamp 58 is utilized in FIG. 1 to provide clamping pressure between cooling member 53 and electronic device 51 and generates a compressive force within heat transfer means 54 (e.g., thereby compressing the overall height of porous member 56 in the range of about 5 to 10 percent). This force also helps to establish thermal contact between the conductive fluid, porous member, cooling and electronic device components. This clamping may be designed to provide a force over long periods as shown in FIG. 6 (spring 59). Providing a compressive force to the thermally conductive fluid further aids wetting of the upper conducting surface and/or cooling member contact surface by the thermally conductive fluid.

Figure 4:
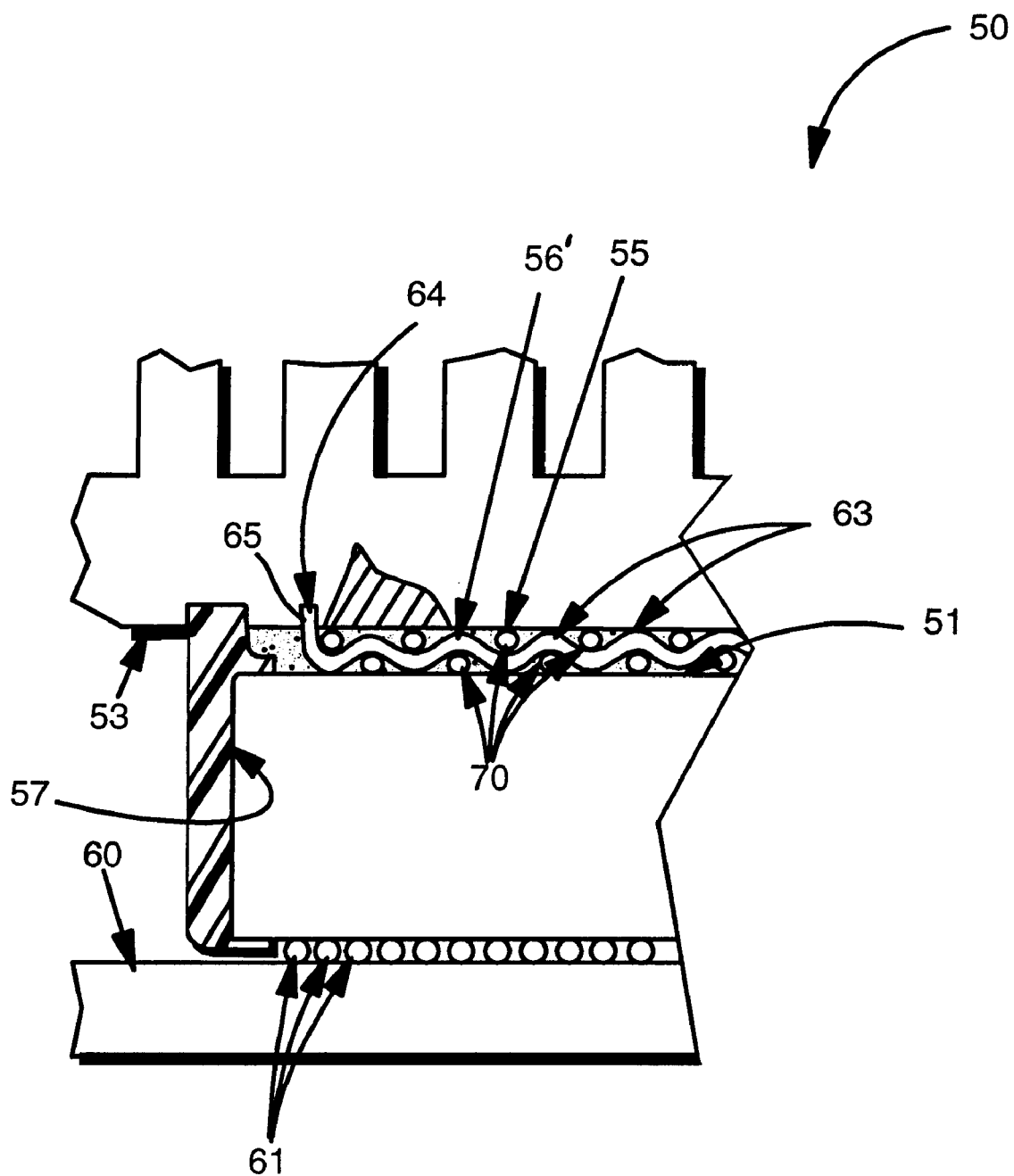
FIG. 4 is a partial, side elevational view of a porous member such as shown in FIG. 3 located between an electronic device and a cooling member, this porous member being secured to the cooling member.
Figure 7:
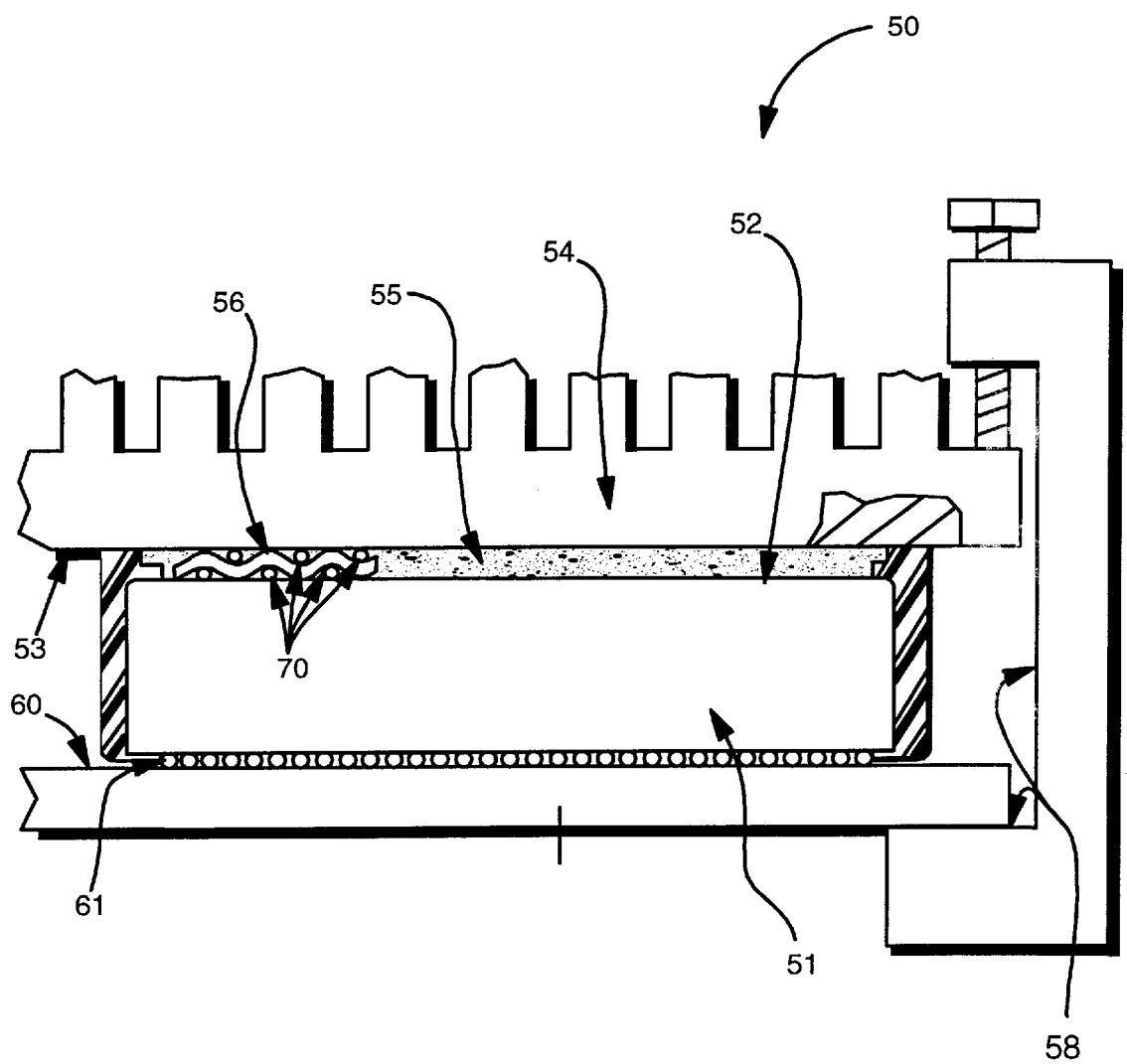
FIG. 7 is a side elevational view, partly in cross-section, of a thermally conductive structure for restricting thermal fluid material movement without requiring the use of a seal as this term is used in the art.

Around the perimeter of electronic device 51 is a seal 57 that extends beyond the electronic device heat transfer surface to the cooling member to substantially prevent evaporation and migration of the thermally conductive fluid 55, particularly during device operation, as shown in FIGS. 1 and 4 (FIG. 7 shows an electronic package without such a seal 57). Depending on the nature of the conductive fluid and the application of the package, this seal may not be required. This seal is preferably of an elastomeric material, a peroxide cured elastomer such as LCS-745 from Dow Corning Corporation being a representative material. However, the seal may also be made of a metallic or plastic material.

Figure 5:
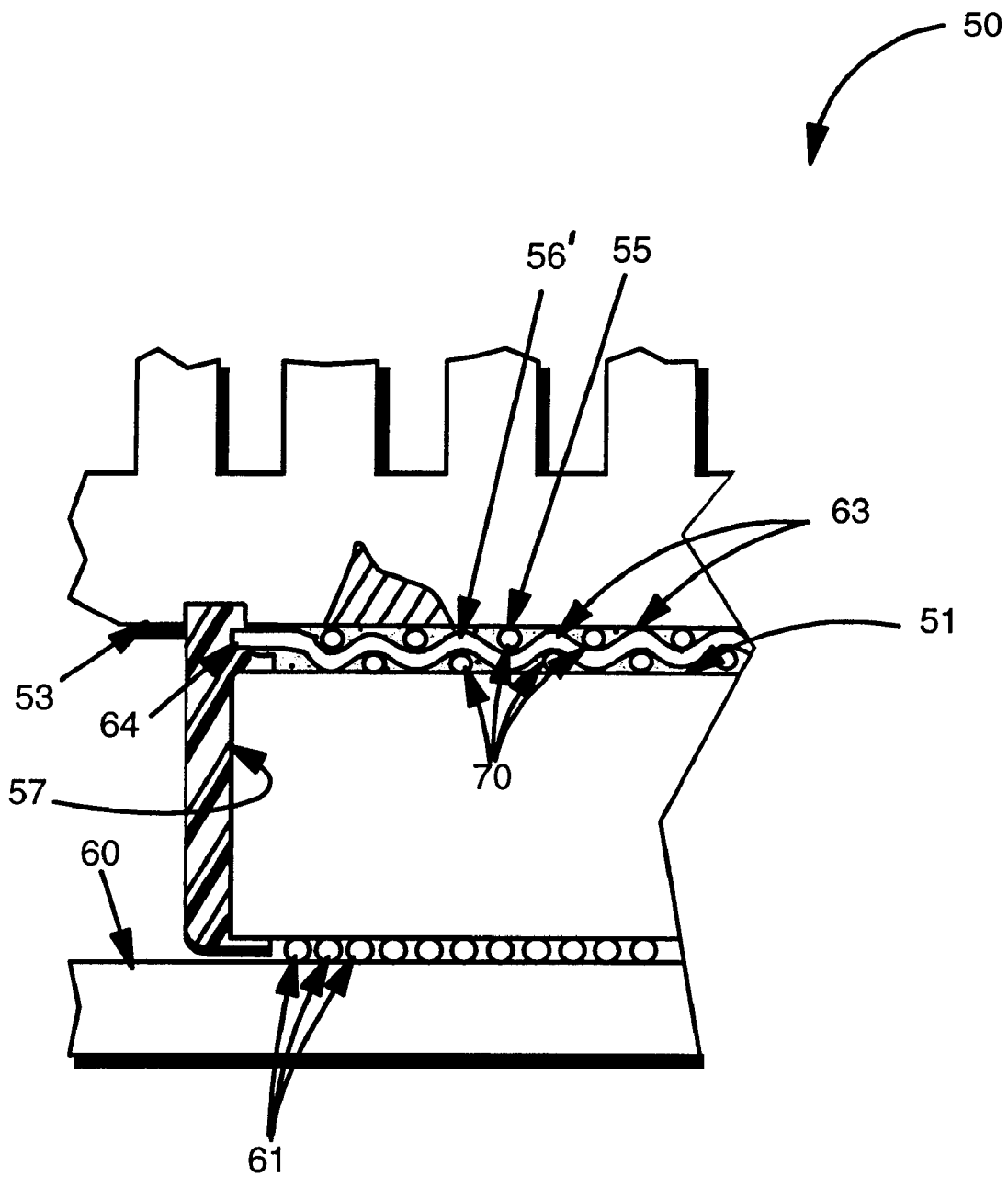
FIG. 5 is a partial, side elevational view of a porous member according to another embodiment of the invention located between an electronic device and a cooling member, this porous member secured to the seal.

FIGS. 4 and 5 show two means of positioning and restraining the porous member 56' in the space between electronic device 51 and cooling member 53. In FIG. 4, at least one (and preferably several) wire ends 64 of porous member 56 are located within corresponding apertures 65 in cooling member 53. In FIG. 5, wire ends 64 of porous member 56 are located within corresponding apertures in the surrounding elastomer seal 57. Positioning of the wire ends 64 into apertures thus restraining the porous member minimizes the movement of the porous member after multiple thermal cycles. Ends 64 can be soldered in position, if desired. For an electronic device that is not centered about the package neutral point for thermal deformation, operating temperature differences may cause the porous member to shift (move) out of position, causing some or all of the thermally conductive fluid 55 to be lost. By securing the wire ends 64 in the package as shown, such shifting and fluid loss is substantially prevented.

Figure 8:
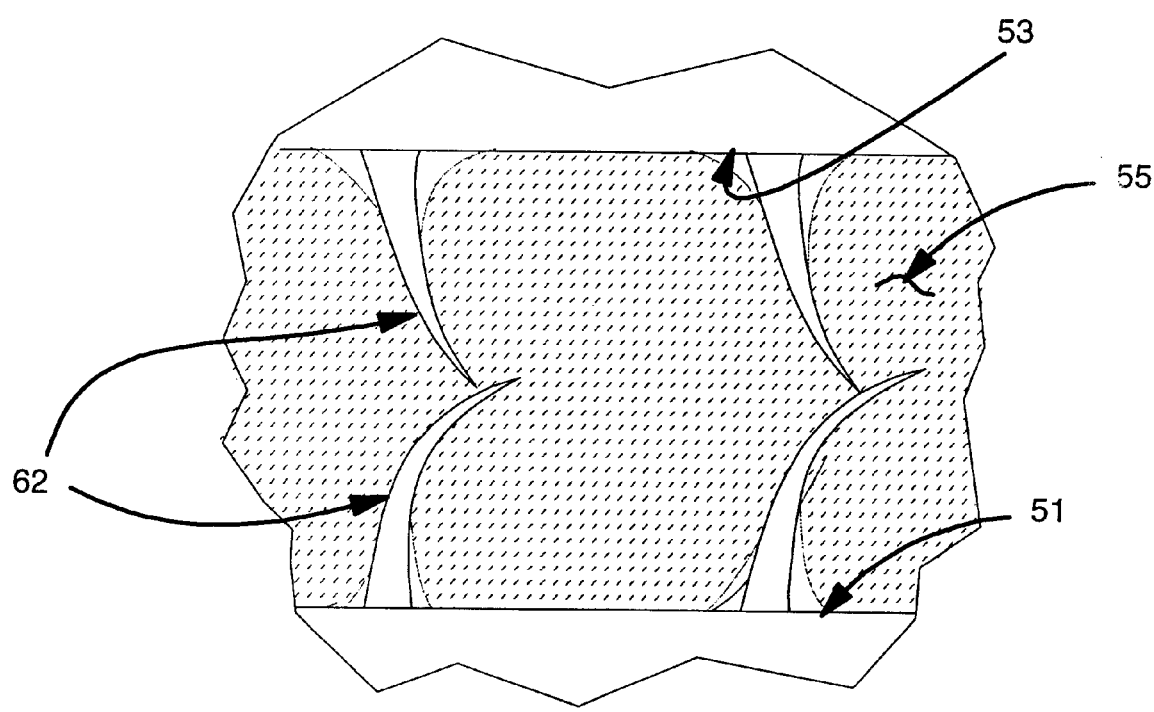
FIG. 8 is a cross-sectional view of a side elevation of a flexible tab fluid retention means.

FIG. 8 is a much enlarged, partial cross-sectional view through a cooling device 53 and an electronic device 51, showing one example of thermally conductive fluid 55 in contact with flexible tabs 62. Flexible tabs 62 are configured to interact during possible thermal excursions of the electronic device and subsequent dimensional changes of both the electronic device, cooling device, and thermally conductive fluid. Such thermal excursions may be created by changing power requirements of the electronic device, which in turn changes heat transference through the interim conductive fluid. As the temperature of the components increase, the size of these components also increase. The contained volume of the thermally conductive fluid, in particular, increases. The flexible tabs create a shear stress within the conductive fluid, increasing the mean pressure within the fluid and restraining the fluid substantially in the center of the electronic device and therefore typically in the area of highest temperature. The flexible tabs are preferably of a metallic material to increase the heat transfer surfaces of the device and cooling member.

Examples of such metallic materials include copper and aluminum. Such tabs may be secured to respective surfaces of members 51 and 53 by adhesive, soldering, etc. However, an elastomeric material can also be used to provide a more flexible structure.

While there have been shown and described what are at present the preferred embodiments of the invention, it will be obvious to those skilled in the art that various changes and modifications may be made therein without departing from the scope of the invention as defined by the appended claims.

What is claimed is:

1. An electronic package comprising:
an electronic device having a heat transfer surface;
a cooling member thermally coupled to said heat transfer surface of said electronic device for conducting heat away from said electronic device; and
heat transfer means positioned between said heat transfer surface of said electronic device and said cooling member for transferring heat from said electronic device to said cooling member, said heat transfer means including a thermally conductive fluid positioned in contact with said heat transfer surface and said cooling member, and a porous member which is selected from the group of thermally conductive materials consisting of foamed metals and sintered metals, said porous member being separate from said cooling member and positioned substantially within said thermally conductive fluid for assisting in retaining said thermally conductive fluid in said position in contact with said heat transfer surfaced and said cooling member.

2. The electronic package according to claim 1 wherein said electronic device comprises a semiconductor device.

3. The electronic package according to claim 1 wherein said electronic device comprises a module package containing at least one semiconductor device.

4. The electronic package according to claim 1 wherein said cooling member comprises a heatsink for transferring heat therefrom to a gaseous cooling medium.

5. The electronic package according to claim 1 wherein said cooling member comprises a cold plate for transferring heat therefrom to a liquid cooling medium.

6. The electronic package according to claim 1 wherein said cooling member comprises a cold plate for transferring heat therefrom to a mixed phase fluid cooling medium.

7. The electronic package according to claim 1 wherein said thermally conductive fluid of said heat transfer means comprises thermal grease.

8. The electronic package according to claim 7 wherein said thermal grease is a silicone-based thermal grease.

9. The electronic package according to claim 7 wherein said thermal grease comprises low viscosity oil mixed with thermally conductive particles.

10. The electronic package according to claim 1 wherein said porous member comprises a mesh structure which includes at least two groups of weave elements, said elements of one of said groups having an overall height greater than said elements of another of said groups.

11. The electronic package according to claim 10 wherein said mesh structure is selected from the group of materials consisting of metal, boron nitride, and silicon carbide.

12. The electronic package according to claim 1 further including a seal between said electronic device heat transfer surface and said cooling member to substantially prevent loss of said thermally conductive fluid.

13. The electronic package according to claim 1 further including a seal between said electronic device heat transfer surface and said cooling member to substantially limit movement of said thermally conductive fluid.

14. The electronic package according to claim 1 further including a force application means for applying force onto said cooling member and said electronic device to maintain a compressive force between said cooling member and said electronic device.

15. The electronic package according to claim 1 wherein seal means extends about said electronic device heat transfer surface to said cooling member to inhibit evaporation and migration of said thermally conductive fluid.

16. An electronic package comprising:
an electronic device having a heat transfer surface;
a cooling member thermally coupled to said heat transfer surface of said electronic device for conducting heat away from said electronic device; and
heat transfer means positioned between said heat transfer surface of said electronic device and said cooling member for transferring heat from said electronic device to said cooling member, said heat transfer means including a thermally conductive fluid positioned in contact with said heat transfer surface and said cooling member, and fluid retention means which is selected from the group of thermally conductive material consisting of foamed metals and sintered metals, said fluid retention means being secured to said heat transfer surface and said cooling member and positioned substantially within said thermally conductive fluid for assisting in retaining said thermally conductive fluid in said position in contact with said heat transfer surface and said cooling member.

17. The electronic package according to claim 16 wherein said electronic device comprises a semiconductor device.

18. The electronic package according to claim 16 wherein said electronic device comprises a module package containing at least one semiconductor device.

19. The electronic package according to claim 16 wherein said cooling member comprises a heatsink for transferring heat therefrom to a gaseous cooling medium.

20. The electronic package according to claim 16 wherein said cooling member comprises a cold plate for transferring heat therefrom to a liquid cooling medium.

21. The electronic package according to claim 16 wherein said cooling member comprises a cold plate for transferring heat therefrom to a mixed phase fluid cooling medium.

22. The electronic package according to claim 16 wherein said thermally conductive fluid of said heat transfer means comprises thermal grease.

23. The electronic package according to claim 22 wherein said thermal grease is a silicone-based thermal grease.

24. The electronic package according to claim 22 wherein said thermal grease comprises low viscosity oil mixed with thermally conductive particles.

25. The electronic package according to claim 16 further including a seal between said electronic device heat transfer surface and said cooling member to substantially prevent loss of said thermally conductive fluid.

26. The electronic package according to claim 16 further including a seal between said electronic device heat transfer surface and said cooling member to substantially limit movement of said thermally conductive fluid.

27. The electronic package according to claim 16 further including force application means for applying force onto said cooling member and said electronic device to maintain a compressive force between said cooling member and said electronic device.

28. The electronic package according to claim 16 wherein said fluid retention means comprises a plurality of flexible tabs for movement relative to one another during changes in the rate of heat transference between said electronic device and said cooling member.

29. The electronic package according to claim 28 wherein said flexible tabs are comprised of elastomeric material.

30. The electronic package according to claim 28 wherein said flexible tabs are comprised of metallic material.

31. The electronic package according to claim 16 wherein seal means extends about said electronic device heat transfer surface to said cooling member to inhibit evaporation and migration of said thermally conductive fluid.

32. An information handling system comprising:
a circuitized substrate; and
an electronic package positioned on and electrically coupled to said circuitized substrate, said package including an electronic device having a heat transfer surface, a cooling member thermally coupled to said electronic device for conducting heat away from said electronic device, and heat transfer means positioned between said heat transfer surface of said electronic device and said cooling member for transferring heat from said electronic device to said cooling member, said heat transfer means including a thermally conductive fluid positioned in contact with said heat transfer surface and said cooling member, and a porous member which is selected from the group of thermally conductive materials consisting of foamed metals and sintered metals, said porous member being separate from said cooling member and positioned substantially within said thermally conductive fluid for assisting in retaining said thermally conductive fluid in said position in contact with said heat transfer surface and said cooling member.

33. An information handling system comprising:

a circuitized substrate; and an electronic package positioned on and electrically coupled to said circuitized substrate, said package including an electronic device having a heat transfer surface, a cooling member thermally coupled to said electronic device for conducting heat away from said electronic device, and heat transfer means positioned between said heat transfer surface of said electronic device and said cooling member for transferring heat from said electronic device to said cooling member, said heat transfer means including a thermally conductive fluid positioned in contact with said heat transfer surface and said cooling member, and a fluid retention means which is selected from the group of thermally conductive material consisting of foamed metals and sintered metals, said fluid retention means being secured to said heat transfer surface and said cooling member and positioned substantially within said thermally conductive fluid for assisting in retaining said thermally conductive fluid in said position in contact with said heat transfer surface and said cooling member.

34. The electronic package according to claim 33 wherein seal means extends about said electronic device heat transfer surface to said cooling member to inhibit evaporation and migration of said thermally conductive fluid.

35. A heat transfer structure for transferring heat from a heat-generating electronic device to a cooling member, said structure comprising:

a porous member which is selected from the group of thermally conductive materials consisting of foamed metals and sintered metals; and a quantity of thermally conductive fluid positioned substantially on and around said porous member, said heat transfer structure being positioned between said electronic device and said cooling member.

36. The heat transfer structure of claim 1 wherein said porous member comprises a mesh structure which includes at least two groups of weave elements, said elements of one group having an overall height greater than said elements of another of said groups.

37. The heat transfer structure of claim 36 wherein said mesh structure is selected from the group of materials consisting of metal, boron nitride and silicon carbide.

38. The heat transfer structure of claim 33 wherein said thermally conductive fluid comprises thermal grease.

39. The heat transfer structure of claim 38 wherein said thermal grease is a silicone-based thermal grease.

40. The heat transfer structure of claim 38 wherein said thermal grease comprises low viscosity oil mixed with thermally conductive particles.

* * * * *